US008255616B2

(12) United States Patent
Scouller et al.

(10) Patent No.: US 8,255,616 B2
(45) Date of Patent: Aug. 28, 2012

(54) NON-VOLATILE MEMORY DEVICE AND METHOD THEREFOR

(75) Inventors: Ross S. Scouller, Austin, TX (US);
Daniel L. Andre, Austin, TX (US);
Stephen F. McGinty, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 243 days.

(21) Appl. No.: 12/685,856

(22) Filed: Jan. 12, 2010

(65) Prior Publication Data
US 2011/0173373 A1 Jul. 14, 2011

(51) Int. Cl.
*G06F 12/00* (2006.01)
(52) U.S. Cl. ....................................... 711/103
(58) Field of Classification Search .................. None
See application file for complete search history.

(56) References Cited

U.S. PATENT DOCUMENTS

| | | | | |
|---|---|---|---|---|
| 5,369,616 A * | 11/1994 | Wells et al. | ............. | 365/185.22 |
| 6,904,400 B1 | 6/2005 | Peri et al. | | |
| 7,058,755 B2 | 6/2006 | Nallapa | | |
| 7,406,558 B2 | 7/2008 | Przybylek | | |
| 2003/0099134 A1 * | 5/2003 | Lasser et al. | ............. | 365/185.29 |
| 2005/0013154 A1 * | 1/2005 | Honda et al. | ................... | 365/145 |
| 2005/0132128 A1 * | 6/2005 | Lee | ................................. | 711/103 |
| 2005/0138615 A1 | 6/2005 | Farkas et al. | | |
| 2006/0002197 A1 * | 1/2006 | Rudelic | ..................... | 365/189.09 |
| 2007/0150645 A1 | 6/2007 | Chandramouli et al. | | |
| 2007/0192532 A1 * | 8/2007 | Ogle | ............................. | 711/103 |
| 2007/0214329 A1 * | 9/2007 | Fischer | ......................... | 711/159 |
| 2008/0046608 A1 | 2/2008 | Lee et al. | | |
| 2008/0320263 A1 | 12/2008 | Nemiroff et al. | | |
| 2009/0113112 A1 * | 4/2009 | Ye et al. | ........................ | 711/102 |
| 2010/0082883 A1 * | 4/2010 | Chen et al. | ..................... | 711/103 |

OTHER PUBLICATIONS

PCT/US2011/020349 International Search Report and Written Opinion mailed Sep. 30, 2011.

* cited by examiner

*Primary Examiner* — Kaushikkumar Patel (57) ABSTRACT

A method of storing information at a non-volatile memory includes storing a first status bit at a sector header of the memory prior to erasing a sector at the memory. A second status bit is stored after erasing of the sector. Because the erasure of the sector is interleaved with the storage of the status bits, a brownout or other corrupting event during erasure of the record will likely result in a failure to store the second status bit. Therefore, the first and second status bits can be compared to determine if the data was properly erased at the non-volatile memory. Further, multiple status bits can be employed to indicate the status of other memory sectors, so that a difference in the status bits for a particular sector can indicate a brownout or other corrupting event.

20 Claims, 6 Drawing Sheets

NON-VOLATILE MEMORY DEVICE AND METHOD THEREFOR

BACKGROUND

1. Field of the Disclosure

The present disclosure is related generally to data processing devices, and more particularly to data processing devices having non volatile memory devices.

2. Description of the Related Art

An electronic device can employ a dedicated electrically erasable programmable read-only memory (EEPROM) to store information, such as configuration information, that is to be retained when power is not supplied to the device. However, some dedicated EEPROM devices can be undesirably expensive or difficult to manufacture. Accordingly, some devices emulate a dedicated EEPROM using a portion of a flash memory to mirror information stored at a RAM, so that the stored information is maintained when the device is not powered. The remaining portion of the flash memory is used for normal operations of the device. By using a portion of existing flash memory used for other operations, rather than a dedicated EEPROM, the cost of the electronic device can be reduced. However, power fluctuations and asynchronous resets (referred to as "brown-outs) at the device can cause corruption of the mirrored information at the flash memory.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A method of storing information at a non-volatile memory includes storing a first status bit at a sector header of the memory prior to erasing a sector at the memory. A second status bit is stored after erasing of the sector. Because the erasure of the sector is interleaved with the storage of the status bits, a brownout or other corrupting event during erasure of the record will likely result in a failure to store the second status bit. Therefore, the first and second status bits can be compared to determine if the data was properly erased at the non-volatile memory. Further, multiple status bits can be employed to indicate the status of other memory sectors, so that a difference in the status bits for a particular sector can indicate a brownout or other corrupting event.

Figure 1:
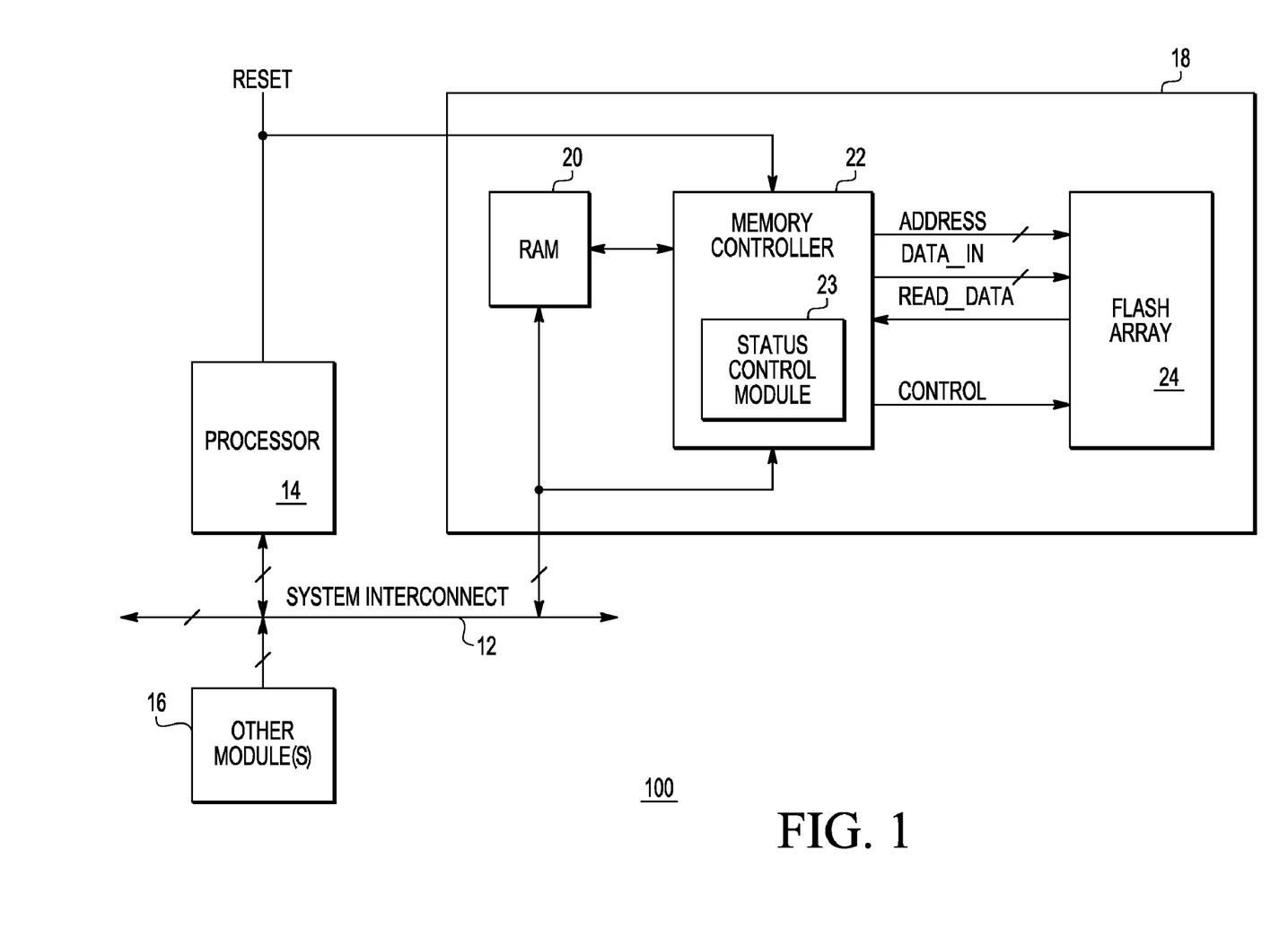
FIG. 1 is a block diagram illustrating a data processing device that includes an EEPROM device in accordance with a specific embodiment of the present disclosure.

FIG. 1 is a block diagram illustrating a data processing device 100 that includes an EEPROM device in accordance with a specific embodiment of the present disclosure. Data processing device 100 includes a processor 14, other module(s) 16 (if any), a system interconnect 12, and an EEPROM device 18. Each of processor 14, other module(s) 16, and EEPROM device 18 are connected to system interconnect 12. EEPROM device 18 includes a random access memory (RAM) 20, a memory controller 22, and a flash array 24. Memory controller 22 includes a status control module 23. Memory controller 22 is connected to a volatile memory, illustrated as RAM 20, and to flash array 24 via nodes labeled ADDRESS, DATA_IN, READ_DATA, STATUS, and CONTROL. RAM 20 and memory controller 22 are connected to system interconnect 12. A reset signal is provided to processor 14 and memory controller 22. The reset signal may be, for example, a global reset signal for data processing device 100.

For the purpose of illustration, EEPROM device 18 is described as a discrete device, but EEPROM device 18 can be included at an integrated circuit that includes other components of data processing device 100, such as processor 14. In an embodiment, flash array 24 can include NAND flash, NOR flash, or another type of non-volatile memory.

Memory controller 22 is configured to store and retrieve information at flash array 24. Memory controller 22 can store information at flash array 24 by providing an address via node ADDRESS, data via node DATA_IN, and configuring control information at node CONTROL. Similarly, memory controller 22 can retrieve information stored at flash array 24 by providing an address at node ADDRESS and configuring control information at node CONTROL to perform a read operation at flash array 24 whereby the information stored at the address is returned to control module 22 via node READ_DATA. Memory controller 22 can include a data processing device such as a microprocessor, a microcontroller, logic devices, or a combination thereof that is configured to administer the procedures associated with memory controller 22.

During operation, processor 14 or another master device can communicate directly with RAM 20 via system interconnect 12 to store and retrieve information at RAM 20 via an access request. For purposes of discussion, an access request to store information at the RAM 20 is referred to as a "write access" and an access request to retrieve information stored at the RAM 20 is referred to as a "read access." An access request includes an access address corresponding to a location at RAM 20, and, in the case of a write access, data information that is to be written to the provided address. In response to a write access, RAM 20 stores the received write data at a memory location associated with the received write address. In response to a read access, RAM 20 retrieves the data stored at the memory location indicated by the address and provides the data via system interconnect 12.

In the case of a write access, memory controller 22 can also store the data associated with the write access at flash array 24. The data will thus be preserved in the event of a power fluctuation (including a power loss) or reset event at the data processing device 100. To illustrate, in response to a write request, memory controller 22 determines whether the data associated with the write request is different than the data stored at the memory location of the RAM 20 indicated by the address associated with the write request. If so, memory controller 22 stores both the address and the data associated with the write request at flash array 24. For purposes of discussion, the address/data pair that is stored at flash array 24 in response to a write access is collectively referred to as a record.

In an embodiment, flash array 24 is configured so that records cannot be individually erased. Accordingly, memory controller 22 can generate a new record for each write access that results in modification of data stored at the RAM 20. More than one record can therefore be associated with a particular memory location of RAM 20, with the most recently created record associated with a particular memory address storing the most up-to-date data for that address. For purposes of discussion, the most up-to-date data associated with an address is referred to herein as "valid data," while data associated with an address of RAM 20 that has been replaced by newer data is referred to as "invalid data."

To illustrate, in response to a write access that modifies data stored at a memory location of RAM 20, memory controller 22 determines whether a record associated with that address is stored at the flash array 24. If not, memory controller 22 creates a new record at flash array 24, and stores the data and address associated with the write access at the new record.

In the illustrated embodiment of FIG. 1, it is assumed that memory controller 22 creates new records at flash array 24 in a sequential manner whereby each new record is stored at a location logically adjacent and immediately following the location used to store the record created in response to the preceding write access. As data is stored at RAM 20 and successive records corresponding to the updates are created at flash array 24, the available space to store information at flash array 24 is reduced. In response to determining the amount of space available at flash array 24 is below a defined or programmable threshold, memory controller 22 performs data consolidation and selective data erasure to ensure that there are empty locations, sequential to the most recently updated location, that are available to accommodate new records in response to data updates at RAM 20. The successive creation of new records, consolidation of records, and erasure sectors is performed in a round-robin manner so that after the last (bottom) location at flash array 24 is filled, the next location to be filled is at the beginning (top) of flash array 24. This technique can be better understood with reference to FIG. 2.

Figure 2:
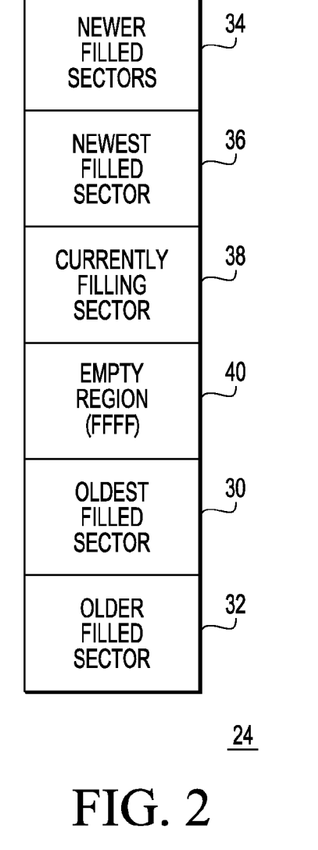
FIG. 2 is a block diagram illustrating the flash array of FIG. 1 according to a specific embodiment of the present disclosure.

FIG. 2 is a block diagram illustrating flash array 24 of FIG. 1 according to a specific embodiment of the present disclosure. FIG. 2 illustrates flash array 24 during operation of EEPROM device 18. In the illustrated embodiment, flash array 24 includes a plurality of sectors, including sectors 30, 32, 34, 36, and 38 (sectors 30-38) wherein a sector is logically contiguous portion of flash array 24. Flash array 24 also includes an empty region 40, which includes one or more empty sectors. An empty sector refers to a sector where all locations allotted for storing records are erased.

In the illustrated embodiment, sectors 30-38 include an oldest sector 30 (the sector that was least-recently filled), an older sector 32 (the sector that was filled after filling oldest sector 30), newer filled sectors 34 (one or more sectors filled more recently than was older sector 32), a newest-filled sector 36 (the sector that was most recently filled), and a currently filling sector 38. It is assumed that a filled sector, such as filled sectors 30, 32, 34, and 36, includes no empty locations, so that all locations contain either a record or contain status information associated with the sector. It will be appreciated that although a filled sector includes no empty locations, a particular record of a filled sector can have empty space available to store additional data for the address associated with the record. It is further assumed that currently filling sector 38 is the sector which will store the next record created in response to a write access. During operation, in response to determining the number of erased locations at flash array 24 available to store new records is below a threshold, memory controller 22 performs a consolidation operation by reviewing each record at oldest filled sector 30 and copying each valid record found therein to currently filling sector 38. In particular, to copy a record, memory controller 22 performs a write access to create a new record at currently-filling sector 38 and writes the contents of the record being copied to the new record. Once memory controller 22 determines that all valid records have been copied from oldest filled sector 30 to currently filling sector 38, memory controller 22 performs an erase operation to erase oldest filled sector 30. Thus, the consolidation operation frees space for additional records to be stored at flash array 24.

Each sector at flash memory 24 includes a location configured to store sector status information. Memory controller 22 can access the sector status information associated with a sector to identify how the sector is currently being used. For example, the sector status information can be used to identify that a particular sector is empty, erased, currently filling, or being used for another purpose. This can be better understood with reference to FIG. 3.

Figure 3:
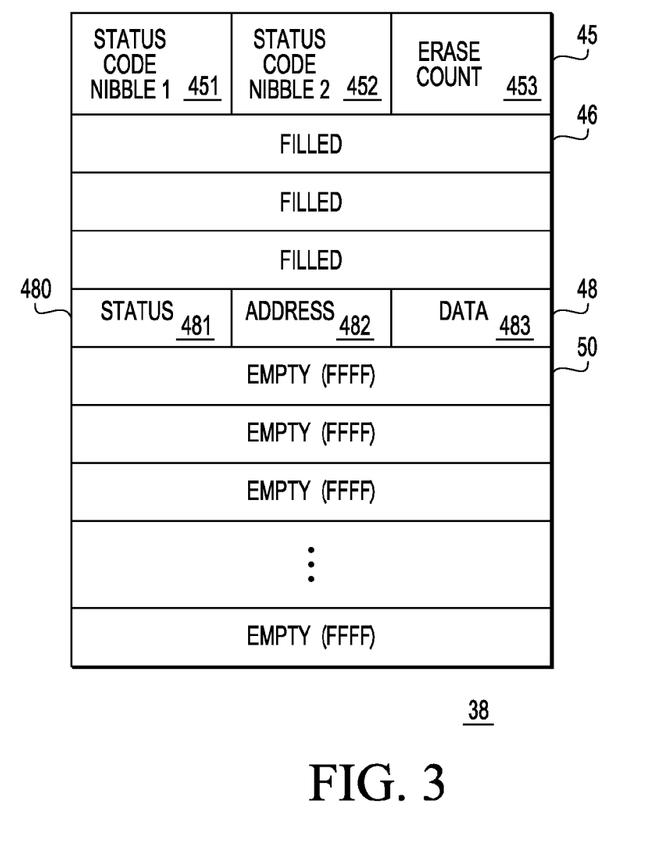
FIG. 3 is a block diagram illustrating a sector of the flash array of FIG. 2 in accordance with a specific embodiment of the present disclosure.

FIG. 3 is a block diagram illustrating currently filling sector 38 of FIG. 2 in accordance with a specific embodiment of the present disclosure. Currently filling sector 38 includes a location 45 for storing sector status information, and a plurality of locations for storing records. Location 45 includes a field 451 for storing a first status code nibble labeled NIBBLE 1, a field 452 for storing a second status code nibble labeled NIBBLE 2, and a field 453 for storing a value representative of the number of times the sector has been erased labeled ERASE COUNT. The combination of NIBBLE 1, NIBBLE 2, and ERASE COUNT may be referred to as a sector header. The first status code nibble is written in one programming operation and the second status code nibble is written in another program operation. The sector status information is described below with reference to FIGS. 4-8.

For the purpose of illustration, currently filling sector 38 includes already-filled locations 46, currently filling location 48, and empty locations 50 (again illustrated parenthetically to include "FFFF," corresponding to the value of data present at locations included at erased sectors). Currently filling sector 38 includes a record 480 having a status information field 481, an address information field 482, and a data information field 483.

During operation, memory controller 22 can monitor system interconnect 12 and determine that a write operation at RAM 20 has occurred, the write operation corresponding to a particular address at RAM 20. Memory controller 22 can further determine whether a record currently stored at flash array 24 includes this address and the same value of data being written to RAM 20. In an embodiment, memory controller 22 may identify more than one record associated with this particular address, in which case, the most recently stored record is determined to be valid, and all other records having this address are determined to be invalid. If memory controller 22 locates a valid record associated with this address, memory controller 22 determines whether the value of the data associated with the valid record matches the value of the data written to RAM 20. If the value of the data associated with the record is the same as the value of the data written to RAM 20, memory controller 22 does not perform a write access to flash memory 24, and continues to monitor system interconnect 12 for a subsequent write operation at RAM 20. If the value of the data associated with the valid record is different from the value updated at RAM 20, memory controller 22 creates a new record at the next available location (location 48 in the present example) at currently filling sector 38, sequentially adjacent to the most recently filled location.

Figure 4:
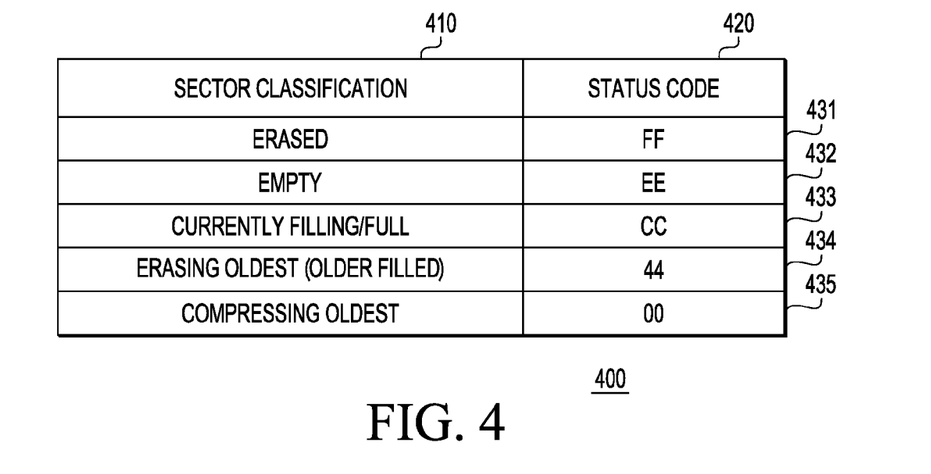
FIG. 4 is a table illustrating sector header status codes in accordance with a specific embodiment of the present disclosure.

FIG. 4 is a table 400 illustrating sector header status codes in accordance with a specific embodiment of the present disclosure. Table 400 includes a column 410 containing sector classifications, and a column 420 containing status codes associated with each sector classification. Memory controller 22 is configured to update the status code stored at the header of a sector when the classification of the sector changes. In an embodiment, status bits used to store records at flash array 24, like other bitcells included at flash array 24, can only be programmed to a logic zero level. Therefore, the status codes used to identify the current classification of a sector differ by how many status bits are programmed to a logic zero level. In an embodiment, a status code includes eight status bits, arranged as two status nibbles containing four status bits each, for example, FIRST NIBBLE(3:0) and SECOND NIBBLE(3:0). Memory controller 22 is configured to program a status bit at the first nibble before programming a corresponding status bit at the second nibble. For example, during a first programming operation, NIBBLE 1(0) can be programmed, and during a subsequent programming operation, NIBBLE 2(0) can be programmed.

Row 431 includes sector classification ERASED and an associated status code FF, wherein NIBBLE 1 has a value of hexadecimal F and NIBBLE 2 has a value of hexadecimal F. It is assumed that a value of FF is the result of a sector-erase operation so memory controller 22 does not need to perform a separate program operation to store the ERASED status code.

Row 432 includes sector classification EMPTY and an associated status code EE. Status code EE is stored by programming the least significant bit of each status nibble, NIBBLE 1(0) and NIBBLE 2(0), to a logic zero level so that the status code is modified from a value of FF to a value of EE. The EMPTY classification corresponds to sectors at, for example, EMPTY REGION 40 of FIG. 2.

Row 433 includes sector classifications CURRENTLY FILLING and FULL, and each of these classifications share status code CC. Status code CC is stored by programming the next-to-least significant bit of each status nibble, NIBBLE 1(1) and NIBBLE 2(1), to a logic zero level. Thus, the status code is modified from a value of EE to a value of CC. The CURRENTLY FILLING classification corresponds to currently filling sector 38 at FIG. 2, and the FULL classification corresponds to filled sectors 30, 32, 34, and 36 of FIG. 2. In an embodiment, a status code can include additional status bits so that unique status codes can be used to differentiate between the CURRENTLY FILLING sector and FULL sectors. In another embodiment, the currently filling sector can be identified by memory controller 22 by searching backwards from the first empty sector to locate the first sector having a sector status code with a value of CC.

Row 434 includes sector classification ERASING OLDEST and an associated status code 44. Status code 44 is stored by programming the most significant bit of each status nibble, NIBBLE 1(3) and NIBBLE 2(3), to a logic zero level. Thus, the status code is modified from a value of CC to a value of 44. In an embodiment, the ERASING OLDEST classification is stored at the full sector that was filled immediately after filling the oldest filled sector. For example, when erasing oldest filled sector 30 at FIG. 2, status code 44 is stored at older filled sector 32 of FIG. 2.

Row 435 includes sector classification COMPRESSING OLDEST and an associated status code 00. Status code 00 is stored by programming the next-most significant bit, NIBBLE 1(2), of each status nibble to a logic zero level. Thus, the status code is modified from a value of 44 to a value of 00. Note that before a sector becomes an oldest filled sector and a candidate for being compressed and subsequently erased, it will have been an older filled sector, and have received the 44 status code at the time that a previous oldest filled sector was being erased.

As previously described, a status bit at the first status nibble is programmed during one programming operation, and the corresponding status bit at the second status nibble is programmed during a subsequent programming operation. By programming the two status bits in a sequential manner, the status code can be stored in a manner whereby a brown-out event that may occur during the programming of the status code can be detected when power is restored following the brown-out event. For example, upon restoration of power to EEPROM device 18, memory controller 22 is configured to determine the status of each sector at flash array 24 by reading the status code included at the header of each sector. If, for example, a sector header includes the status code 4C (NIBBLE 1=4, NIBBLE 2=C), memory controller can determine that a disruption occurred during the storing of the status code because the value at NIBBLE 1 and at NIBBLE 2 are not the same. In this case, memory controller once again attempts to program both status bits (at both NIBBLE 1 and NIBBLE 2) to store a status code with a value of 44. Alternatively, if memory controller receives a value of 44 in response to reading the status code at the sector header, there can be assurance that the first status bit (at NIBBLE 1) was fully programmed. It is important that the programming operation be of sufficient duration. For example, if a programming operation is interrupted, such as by a brown-out event, a status bit may temporarily reflect the desired value, but may later revert to its original (unprogrammed) value.

Figure 5:
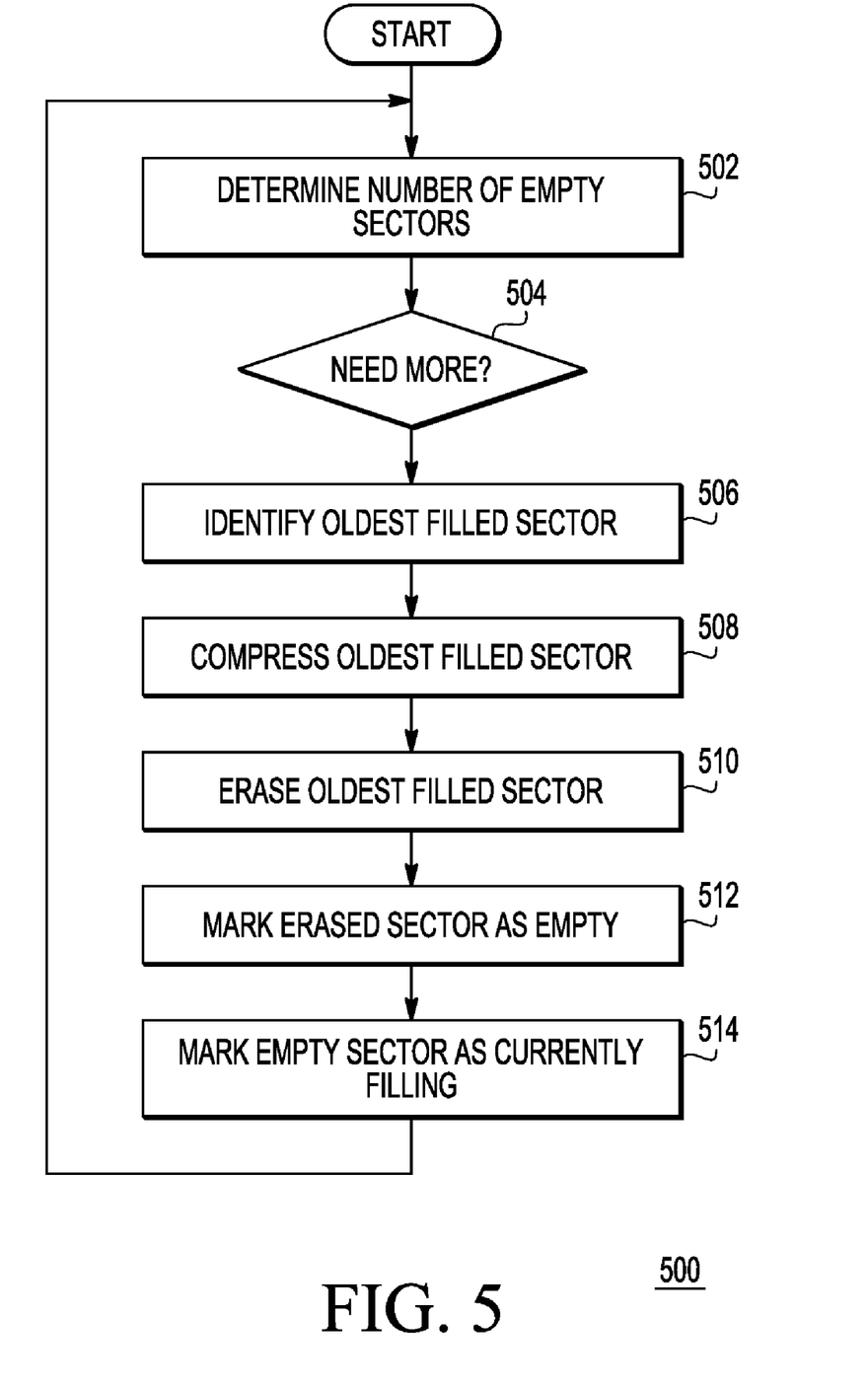
FIG. 5 is a flow diagram illustrating a method for managing sectors at the flash array of FIG. 1 in accordance with a specific embodiment of the present disclosure.

FIG. 5 is a flow diagram illustrating a method 500 for managing sectors at flash array 24 of FIG. 1 in accordance with a specific embodiment of the present disclosure. At any particular time during the operation of EEPROM device 18, memory controller 22 can determine whether a sufficient number of empty sectors are available at flash array 24. For example, in response to filling one sector and, memory controller 22 can transition the next available empty sector to be the currently filling sector, and determine whether the number of remaining empty sectors has fallen below a predetermined number.

Method 500 starts at block 502 where memory controller determines how many empty sectors are currently present at flash array 22. If a sufficient number of empty sectors are available, the flow proceeds from decision block 504 back to block 502. If a sufficient number of empty sectors are not available, the flow proceeds from decision block 504 to block 506, where memory controller 22 determines which full sector represents the oldest filled sector. Referring to FIG. 2, oldest filled sector 30 is the first full sector adjacent to and logically following one or more empty sectors of empty region 40. Once memory controller 22 has identified the oldest filled sector, the flow proceeds to block 508 where memory controller 22 compresses the oldest full sector. The flow proceeds to block 510 where memory controller erases the oldest filled sector. The status code included at the header of the erased sector is FF, corresponding to the erased state of all of the bitcells included at the erased sector. The flow proceeds to block 512 where memory controller 22 reclassifies the newly erased sector as an empty sector by storing a status code of EE at the header of the erased sector. The flow proceeds to block 514 where, having filled the currently filling sector, memory controller 22 reclassifies the oldest empty sector as a new currently filling sector by storing a status code of CC at the header of the next available empty sector. The flow returns to block 502 where memory controller once again determines how many empty sectors are available at flash array 24.

Figure 6:
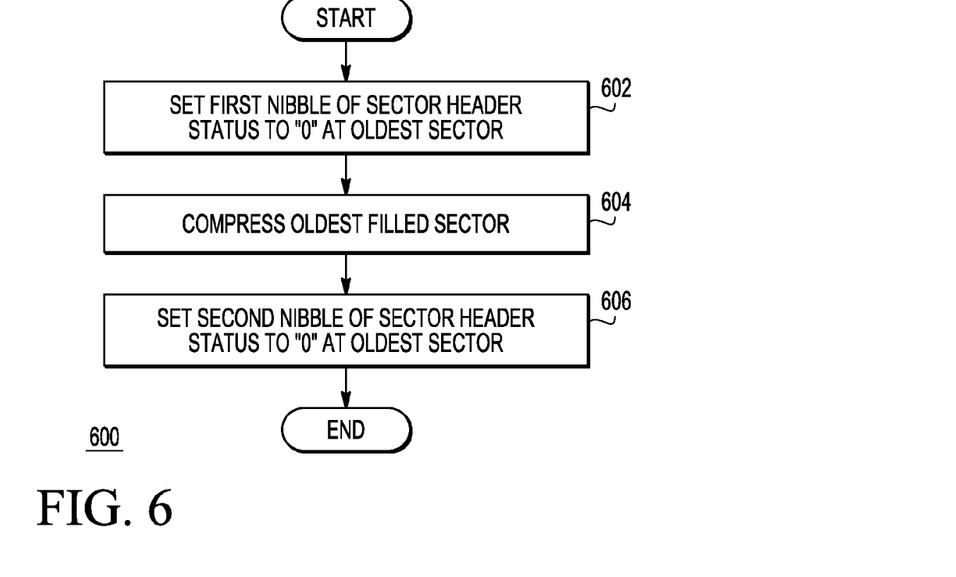
FIG. 6 is a flow diagram illustrating a method for compressing a sector at the flash array of FIG. 1 in accordance with a specific embodiment of the present disclosure.

FIG. 6 is a flow diagram illustrating a method 600 for compressing a sector at flash array 24 of FIG. 1 in accordance with a specific embodiment of the present disclosure. Method 600 can be representative of compress operation associated with block 508 of method 500 illustrated at FIG. 5. Method 600 begins at block 602 where memory controller 22 stores a status code of value 0 at NIBBLE 1 of the header of oldest filled sector. The flow proceeds to block 604 where memory controller 22 compresses the oldest filled sector by copying valid records stored at the oldest full sector to the currently filling sector. The flow proceeds to block 606 where memory controller 22 stores a status code of value 0 at NIBBLE 2 of the header of the newly-compressed sector. Following a brown-out event or the assertion of signal RESET at data processing device 100, memory controller 22 can read status information stored at the header of each sector to determine the current classification of each sector. For example, with reference to method 600, if memory controller 22 determines that the status code stored at NIBBLE 1 and NIBBLE 2 differ, memory controller 22 maintains that the sector has not progressed from being the oldest filled sector to a sector under compression, and therefore memory controller 22 will again perform method 600 in its entirety. In an embodiment, NIBBLE 2 can be programmed immediately after programming NIBBLE 1.

Figure 7:
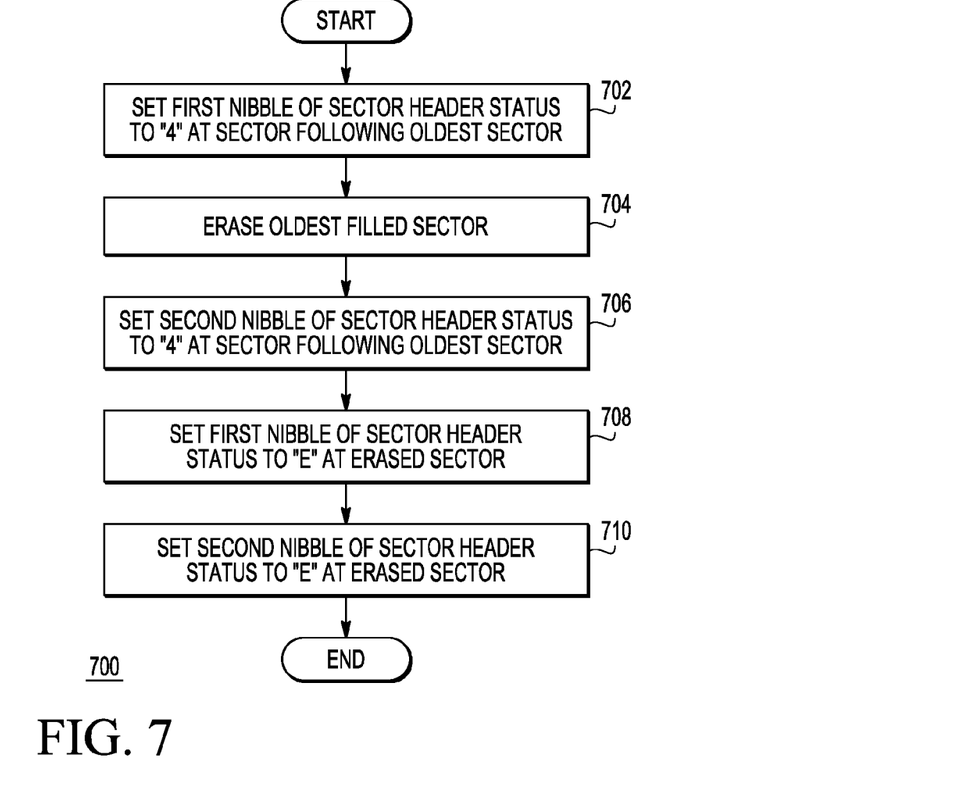
FIG. 7 is a flow diagram illustrating a method for erasing a sector at the flash array of FIG. 1 in accordance with a specific embodiment of the present disclosure.

FIG. 7 is a flow diagram illustrating a method 700 for erasing a sector at flash array 24 of FIG. 1 in accordance with a specific embodiment of the present disclosure. Method 700 can be representative of the erase operation associated with blocks 510 and 512 of method 500 illustrated at FIG. 5. Method 700 begins at block 702 where memory controller 22 stores a status code of value 4 at NIBBLE 1 of the header of older filled sector, which is the full sector adjacent to and logically following the oldest filled sector that is going to be erased. The flow proceeds to block 704 where memory controller 22 erases the oldest filled sector. The flow proceeds to block 706 where memory controller 22 stores a status code of value 4 at NIBBLE 2 of the header of older filled sector. Memory controller 22 considers the sector to be an erased sector only if it receives a value of 44 in response to reading the status code at the header of the older filled sector. For example, if a brown-out occurred while programming the status bit at NIBBLE 2 of the older filled sector, and upon returning to operation memory controller 22 receives a value of 4C in response to reading the sector status code at the older filled sector, memory controller 22 classifies the sector as still being a full sector, and will repeat the first three steps of method 700. In an embodiment, both nibbles at the older filled sector can be programmed before the erase operation at the oldest filled sector is initiated.

The flow proceeds to block 708 where memory controller 22 stores a status code of value E at NIBBLE 1 of the newly erased sector. The flow proceeds to block 710 where memory controller 22 stores a status code of value E at NIBBLE 2 of the newly erased sector. Only if memory controller 22 receives a value of EE in response to reading the status code at the header of this sector, does memory controller 22 consider the sector to be an empty sector. For example, if a brown-out occurred while programming the status bit at NIBBLE 2, and upon returning to operation memory controller 22 receives a value of EF in response to reading the status code at a sector, memory controller 22 classifies that sector as a newly erased sector and once again stores the EE status code to identify the newly erased sector as an empty sector.

Figure 8:
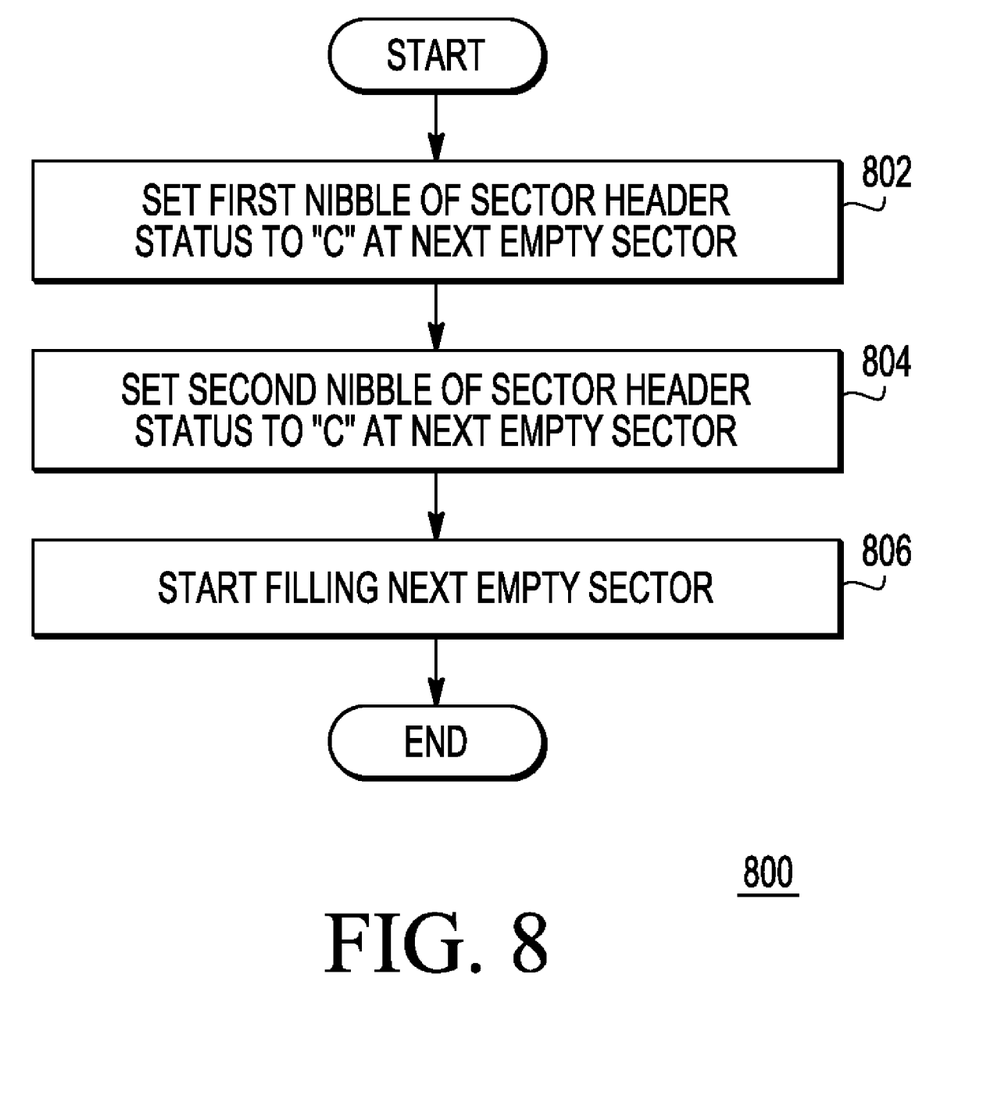
FIG. 8 is a flow diagram illustrating a method for configuring an empty sector at the flash array of FIG. 1 as a currently filling sector in accordance with a specific embodiment of the present disclosure.

FIG. 8 is a flow diagram illustrating a method 800 for configuring an empty sector at flash array 24 of FIG. as a currently filling sector in accordance with a specific embodiment of the present disclosure. Method 800 can be representative of the operation performed at block 514 of method 500 illustrated at FIG. 5. Method 800 begins at block 802 where memory controller 22 stores a status code of value C at NIBBLE 1 at the header of the next available empty sector (the sector adjacent to and logically following a sector that just filled). The flow proceeds to block 804 where memory controller 22 stores a status code of value C at NIBBLE 2 at the header of the same sector. The flow proceeds to block 806 where memory controller 22 can begin filling this sector in response to updates at RAM 20. Memory controller 22 only determines that a sector is classified as a currently filling sector if the value of CC is received in response to reading the status code at the header of that sector, and the sector is immediately adjacent to and logically preceding an empty sector. If the status code present at NIBBLE 1 and NIBBLE 2 differ (such as CE), memory controller 22 concludes that the sector is an empty sector, and again programs both nibbles of the status code with a value of C to classify the sector as a currently filling sector.

Figure 9:
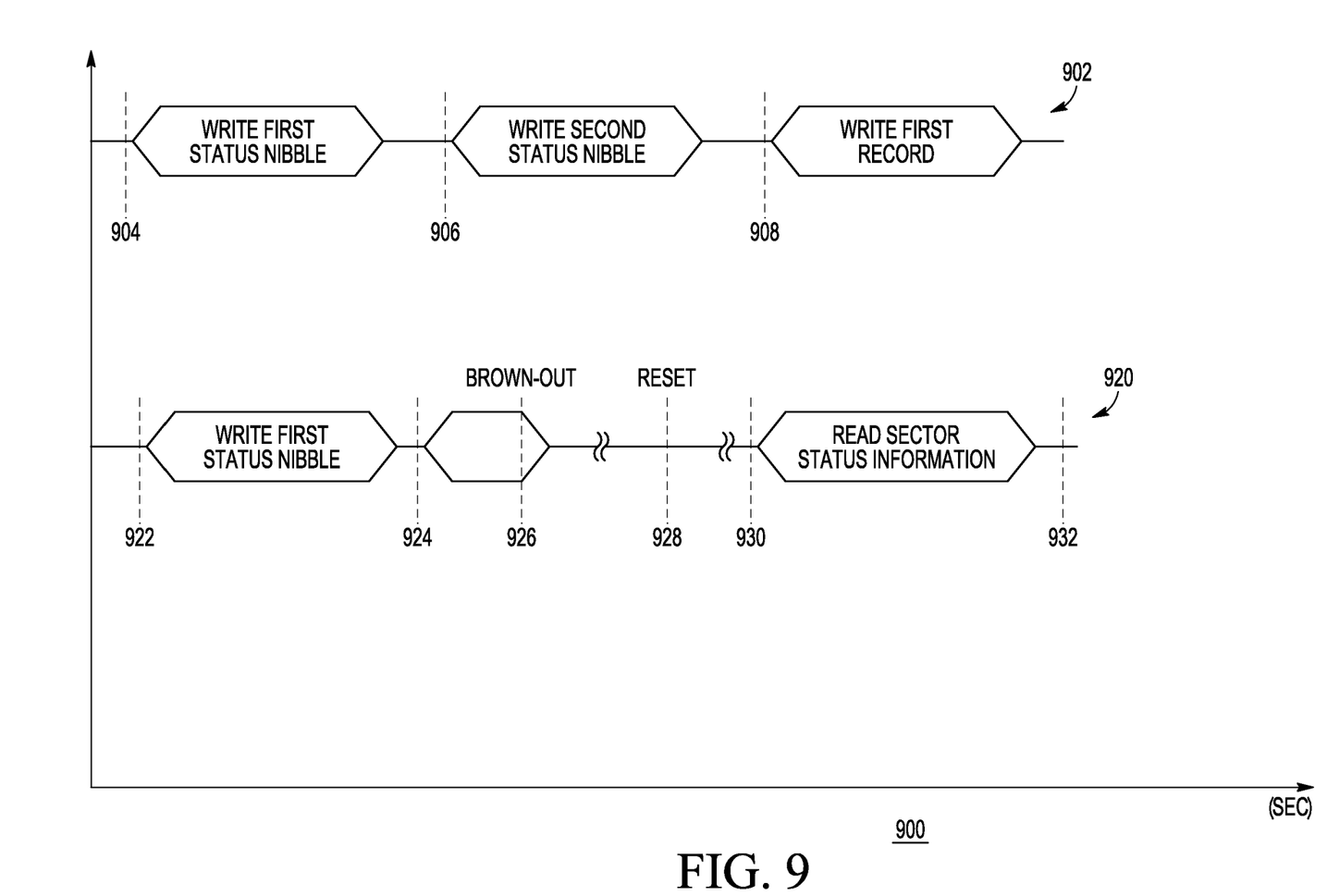
FIG. 9 is a timing diagram illustrating sector header programming operations in accordance with a specific embodiment of the present disclosure.

FIG. 9 is a timing diagram 900 illustrating sector header programming operations in accordance with a specific embodiment of the present disclosure. Timing diagram 900 includes a programming operation 902, which is successfully completed, and a programming operation 920, which is interrupted by a brown-out event. Programming operation 902 may correspond to method 800 of FIG. 8 wherein memory controller 22 configures an empty sector to operate as a currently filling sector by writing the same status code value (such as hexadecimal C) to each status code nibble at the header of the sector. Programming operation 902 begins at time 904 where memory controller 22 writes a first sector status code nibble, such as NIBBLE 1 at field 451 of the sector header (location 45) at FIG. 4. Memory controller proceeds to writes a second sector status code nibble, such as NIBBLE 2 at time 906 at field 452 of the sector header at FIG. 4. At a later time 908, memory controller 22 reads this location to determine the current classification of the corresponding sector. Because programming operation 902 completed successfully, both status nibbles contain the same value and memory controller 22 identifies the sector as the currently filling sector.

Programming operation 920 begins at time 922 where memory controller 22 writes a first sector status code nibble, such as NIBBLE 1 at field 451 of the sector header (location 45) at FIG. 4. Memory controller 22 proceeds to begin writing a second sector status code nibble at time 924, such as NIBBLE 2 at field 452 of the sector header at FIG. 4, but the programming operation is interrupted by a brown-out event at time 926. Furthermore, because the programming operation was interrupted before the second status code nibble was written, only one status code nibble of a corresponding pair of status code nibbles is successfully written. Following the brown-out event, signal RESET is asserted at data processing device 100 at time 928. Memory controller 22 proceeds to restore the contents of RAM 20 based on information stored at flash array 24. At time 930, memory controller 22 reads the header information of the sector that was being programmed at the time of the brownout event, and determines that the sector status information is invalid based on the fact that the value of NIBBLE 1 and NIBBLE 2 are different. Therefore, memory controller 22 repeats programming operation 902 wherein both status code nibbles are programmed to identify the sector as the currently filling sector.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, techniques disclosed herein can be combined with other techniques to further increase the data storage integrity of EEPROM device 18. In an embodiment, error detection or error correction codes can be included with data stored at a record. In another embodiment, read operations can be performed at flash array 24 using analog reference signals that set a higher standard for sensing logic one and logic zero programmed states at a bit cell being read.

As used herein, programming refers to storing a logic level zero to a bitcell at flash array 24 and erasing refers to storing a logic level one to the bitcell. However, in an another embodiment, programming may refer to storing a logic level one to a bitcell and erasing may refer to storing a logic level zero to the bitcell. A logic level zero may also be referred to as a logic low or a logic level one may also be referred to as a logic high. In an embodiment, two or more nibbles can be used to provide redundancy for each status bit. For example, the status code C can be replicated at each nibble of a byte of a data word so that the status code includes sixteen bits of information, and the resulting sequence of status states can proceed from FFFF, to FFEE, to EEEE, to EECC, to CCCC, etc.

The term node is used to refer to a single conductor or a plurality of conductors operable to conduct signals, and for simplicity, the name of a node and the signal conducted at the node are used synonymously. For example, node ADDRESS can conduct a signal ADDRESS. The conductors as discussed herein may be illustrated as or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, a single conductor carrying multiple signals may be separated out into various different conductors carrying subsets of these signals. Therefore, many options can be used to transfer signals without departing from the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
in response to receiving a request to erase a first sector at a non-volatile memory:
storing a first status indicator at a sector header of the non-volatile memory at a first time, the first status indicator to indicate the first sector is to be placed an erased state;
erasing the first sector of the non-volatile memory at a second time, the second time after the first time;
storing a second status indicator at the sector header at a third time, the third time after the second time, the second status indicator to indicate the first sector is in the erased state;
in response to determining, at a fourth time after the third time, that the second status indicator matches the first status indicator:
storing a third status indicator at a location of the sector header at a fifth time after the fourth time;
storing a fourth status indicator at the sector header at a sixth time after the fifth time; and
determining if the third status indicator was properly stored based on a comparison of a value stored at the location of the sector header and the fourth status indicator.

2. The method of claim 1 further comprising:
determining if the first sector has been properly erased based on the first status indicator and the second status indicator.

3. The method of claim 2 further comprising:
in response to determining the first sector has not been properly erased:
storing the first status indicator at a sector header of a non-volatile memory at a fourth time;
erasing a first sector of the non-volatile memory at a fifth time, the fifth time after the fourth time;
storing the second status indicator at the sector header at a sixth time, the sixth time after the fifth time.

4. The method of claim 2 wherein determining if the first sector was properly erased comprises determining if the first sector was properly erased in response to a reset signal.

5. The method of claim 2, further comprising:
in response to determining the first sector has been properly erased:
storing data at the first sector in response to receiving a write request; and
storing the data at a random access memory (RAM) in response to the write request.

6. The method of claim 1, wherein receiving the request to erase the first sector in response to determining the non-volatile memory includes fewer than a threshold number of sectors available to store data records.

7. The method of claim 6, further comprising:
in response to determining the determining that a non-volatile memory includes fewer than a threshold number of empty sectors, copying data records from the first sector to a second sector prior to storing the first status indicator.

8. The method of claim 7, further comprising selecting the first sector for copying in response to determining the first sector is a least-recently-written sector of the non-volatile memory.

9. The method of claim 1, wherein the sector header is associated with a second sector of the non-volatile memory.

10. The method of claim 9, wherein the second sector is adjacent to the first sector.

11. A method comprising:
storing a first status bit at a sector header of a first sector at a non-volatile memory at a first time;
storing a second status bit at the sector header of the first sector at a second time, the second time after the first time; and
determining if the first status bit was properly stored at the non-volatile memory based on a value of the second status bit.

12. The method of claim 11, further comprising:
determining a status of the first sector based on the first status bit in response to determining that the first status bit was properly stored.

13. The method of claim 12, wherein determining the status of the first sector comprises determining the first sector is to be erased.

14. The method of claim 12, determining the status of the first sector comprises determining the first sector is in an erased state.

15. The method of claim 12, wherein determining the status of the first sector comprises determining the first sector is designated to store a data record in response to a write request to the non-volatile memory.

16. The method of claim 12, wherein determining the status of the first sector comprises determining the first sector is in a full state such that the sector stores valid data records and does not have available space to store additional data records.

17. A device comprising:
a volatile memory comprising a first memory location;
a non-volatile memory including a plurality of sectors, each of the plurality of sectors operable to store a plurality of data records, each of the plurality of sectors comprising a corresponding sector header including a first location and a second location;
a control module coupled to the non-volatile memory and the volatile memory;
in response to the plurality of sectors including fewer than a threshold number of empty sectors available to store data records, the control module operable to:
store a first status indicator at the first location of a sector header of a selected sector at a first time;
erase the selected sector at a second time, the second time after the first time;
store a second status indicator at the second location of the sector header at a third time, the third time after the second time, the first status indicator and second status indicator to indicate one of the plurality of sectors is in an erased state;
in response to determining at a third time that the second status indicator matches the first status indicator:
store a third status indicator at the first location at a fifth time after the fourth time;
storing a fourth status indicator at the sector header at a sixth time after the fifth time; and
determining if the third status indicator was properly stored based on a comparison of a value stored at the first location and the fourth status indicator.

18. The device of claim 17, wherein in response to a write request, the control module is operable to store data associated with the write request at the volatile memory and at the selected sector.

19. The device of claim 17 wherein the control module is further operable to determine if the selected sector has been properly erased based on the first status indicator and the second status indicator.

20. The device of claim 17, wherein the control module is operable to determine if the selected sector has been properly erased in response to receiving a reset indication.

* * * * *